(12) United States Patent
Lang et al.

(10) Patent No.: US 8,021,201 B2
(45) Date of Patent: Sep. 20, 2011

(54) ELECTRICAL CONTACT CONFIGURATION

(75) Inventors: Christian Lang, Aichach (DE); Daniel Huber, Reutlingen (DE); Achim Silberbauer, Reutlingen (DE); Jochen Kircher, Reutlingen (DE); Adolf Dillmann, Muensingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/513,536

(22) PCT Filed: Oct. 31, 2007

(86) PCT No.: PCT/EP2007/061767
§ 371 (c)(1),
(2), (4) Date: Dec. 8, 2009

(87) PCT Pub. No.: WO2008/055839
PCT Pub. Date: May 15, 2008

(65) Prior Publication Data
US 2010/0093234 A1    Apr. 15, 2010

(30) Foreign Application Priority Data
Nov. 6, 2006  (DE) .......................... 10 2006 052 112

(51) Int. Cl.
*H01R 9/24*    (2006.01)

(52) U.S. Cl. ........................................ 439/884; 439/482

(58) Field of Classification Search .................. 439/169, 439/482, 700, 884, 889
See application file for complete search history.

(56) References Cited

U.S. PATENT DOCUMENTS

| | | |
|---|---|---|
| 3,751,619 A | 8/1973 | Niederer |
| 5,641,315 A | 6/1997 | Swart et al. |
| 6,344,753 B1 | 2/2002 | Takada et al. |
| 2004/0115994 A1 | 6/2004 | Wulff et al. |
| 2004/0239357 A1 | 12/2004 | Tashiro et al. |
| 2005/0037649 A1 | 2/2005 | LaMeres et al. |

FOREIGN PATENT DOCUMENTS

| | | |
|---|---|---|
| DE | 1095363 | 12/1960 |
| DE | 7129887 | 4/1973 |
| DE | 4224444 | 2/1994 |
| JP | 3-263772 | 11/1991 |
| JP | 2006-511905 | 4/2006 |

OTHER PUBLICATIONS

International Search Report, PCT International Patent Application No. PCT/EP2007/061767, dated Jul. 16, 2008.

*Primary Examiner* — Khiem Nguyen
(74) *Attorney, Agent, or Firm* — Kenyon & Kenyon LLP

(57) ABSTRACT

An electrical contact configuration having a test contact point and a contacting element belonging to a testing device for manually touch-contacting the test contact point. The test contact point is a recess, and the contacting element has a contact region producing at least one line contact with the recess.

20 Claims, 3 Drawing Sheets

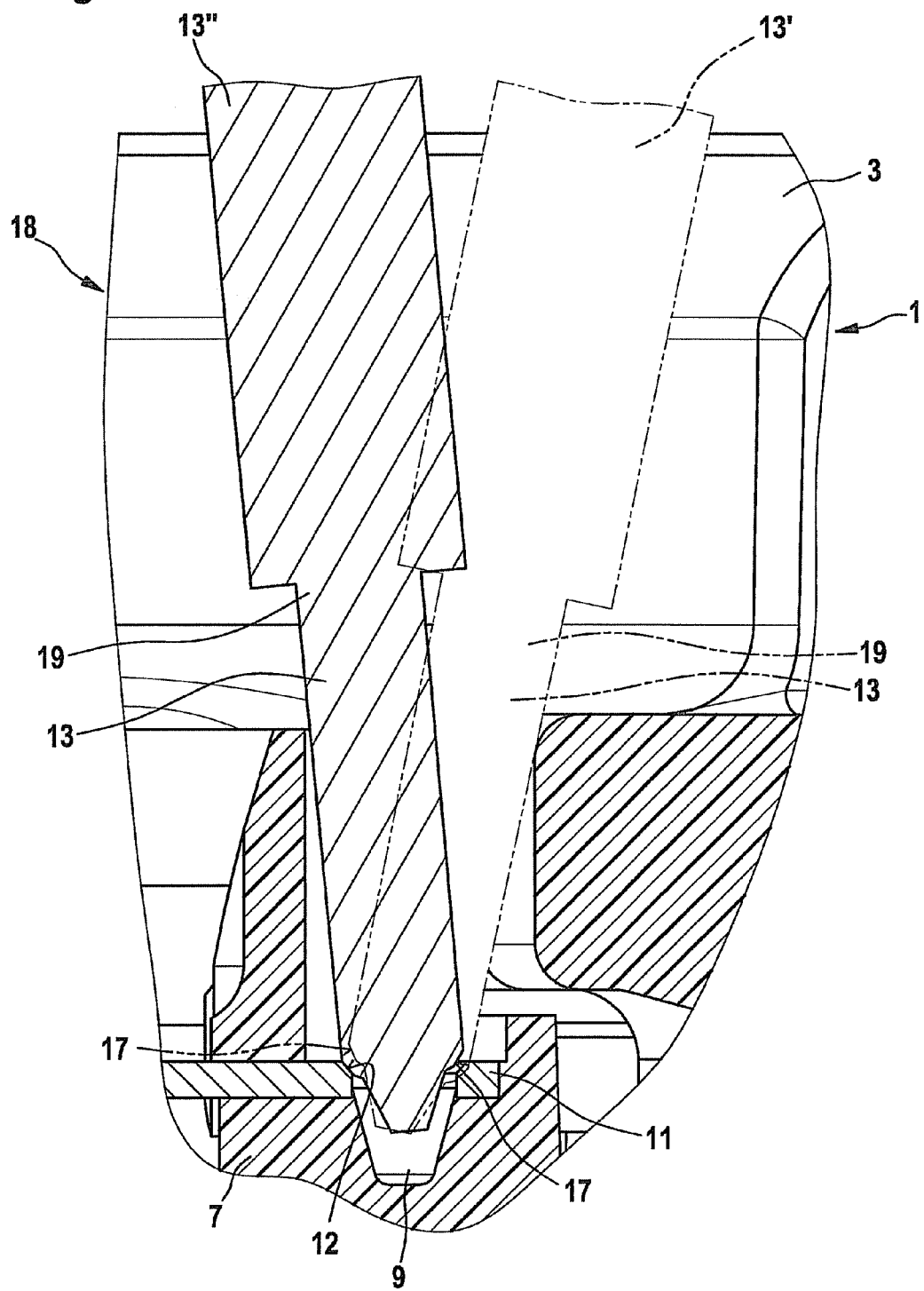

ELECTRICAL CONTACT CONFIGURATION

FIELD OF THE INVENTION

The present invention relates to an electrical contact configuration having a test contact point and a contacting element belonging to a testing device for manually touch-contacting the test contact point.

BACKGROUND INFORMATION

Electrical contact configurations of the type mentioned at the outset are widely known. Thus there are testing devices, for example, that have one or more testing pins, which a user manually presses onto contact plates of an electrical/electronic device that is to be tested. Subsequently, the proper operation of the device is tested using a testing current. The testing pin pressed onto the contact plate creates a point contact that establishes the electrical connection. In such a touch contact, only small currents up to a maximum of 1 Ampere are possible because of the point contact. This is not substantially improved by the use of larger testing pins.

SUMMARY

According to an example embodiment of the present invention, the test contact point is developed as a recess and the contacting element has a contact region producing at least one line contact with the recess. Because the test contact point is provided as a recess, it is not or not only the tip of the contacting element that makes contact with the test contact point, but rather at least a part of the lateral surface of the contacting element makes a line contact with a lateral surface of the test contact point formed by the recess. The line contact allows for a higher flow of current such that it is possible to perform a test under operating conditions even in the high current range above 10 Amperes. In addition, the contacting element is prevented from slipping away from the test contact point.

Furthermore, an electrical contact configuration having a test contact point and a contacting element belonging to a testing device for manually touch-contacting the test contact point is provided, the test contact point being developed as a recess, and the contacting element having a contact region producing at least one surface contact with the recess. Compared to the line contact, the surface contact allows for an even higher flow of current.

Advantageously, the contacting element and/or the recess may have a circular cross section. The thus cylindrically designed contacting element may be inserted into the recess and produce the line contact or surface contact.

Expediently, the diameter of the contacting element is smaller than that of the recess. Thus it is possible to insert the contacting element axially into the recess, a region of the outer surface of the contacting element coming into touch-contact with a region of the inner surface of the recess and thus forming or producing the contact region. If in the process the contacting element is inserted axially into the recess, then a surface contact may be produced, while in the case of a non-axial insertion of the contacting element, because of the tilt, one or two line contacts may be produced.

Furthermore, according to an embodiment of the present invention, the contacting element has a contact tip that is developed at least in regions in the form of a cone segment or sphere segment. Such a development of the contact tip entails that the contacting element may be inserted into the recess particularly readily since the contacting element is guided into the recess by the contact tip and is centered within it, if required. For this purpose, the contact tip may have one or multiple such regions.

Advantageously, the contact tip has the contact region. Advantageously, the maximum diameter of the contact tip is greater than the diameter of the cross-sectionally circular recess. If now the contacting element or the contact tip is inserted into the recess, the contact region situated on the contact tip together with the edge of the recess produces a line contact, which as a ring contact runs across the entire circumference of the contact tip or contact region. Having a contact tip in the shape of a sphere segment, the contacting element may be inserted into the recess from a position deviating from an axially directed position or may be tilted in the recess, while the ring contact is always maintained.

According to a further development of the present invention, the recess is developed at least in regions to have the shape of a cone segment or sphere segment. The surface contact is accomplished by the contact region of a contact tip that is likewise developed in the shape of a cone segment or sphere segment. Expediently, the contact tip and the recess are adapted to each other in terms of their shape. Of course, other developments of the recess and the contact tip mutually adapted in terms of their shape are possible as well, the contours of the contact tip and of the recess, in particular those of the respective contact regions, generally match.

According to a further development of the present invention, the recess is developed to be grooved such that the contacting element may be inserted into the recess at different points.

In practice, this may result in the advantage that the test contact point is easier to reach and that more degrees of freedom with respect to the configuration of different components are provided in the construction of an electrical device to be tested.

According to a further development of the present invention, the contact point is developed as a polyhedron such that its cross section has an edge profile. This is advantageous for example for a contacting element that is to be inserted into the grooved recess since this produces an advantageous line contact. If the contact tip or the contact region and the grooved recess are adapted to each other in terms of their shape, then this produces the advantageous surface contact. If the grooved recess has for example—viewed in the longitudinal extension of the groove—a wedge-shaped cross section, then the contact tip or contact region adapted to it in terms of its shape is likewise developed to be wedge-shaped.

Furthermore, there is a provision for the recess to be developed as a passage. Advantageously, the passage is developed as a plated through-hole. This ensures that an electrical contact may be established at any point of the plated through-hole or of the passage. Expediently, the recess is developed as a test contact point of a printed circuit board. Thus, it is possible to test in a simple manner a proper operation of a device to which the printed circuit board belongs.

BRIEF DESCRIPTION OF THE DRAWINGS

The present invention shall be explained in greater detail below with reference to the figures.

FIG. 5 shows a tolerance compensation of the contact configuration according to an embodiment of the present invention.

DETAILED DESCRIPTION OF EXAMPLE EMBODIMENTS

Figure 1:
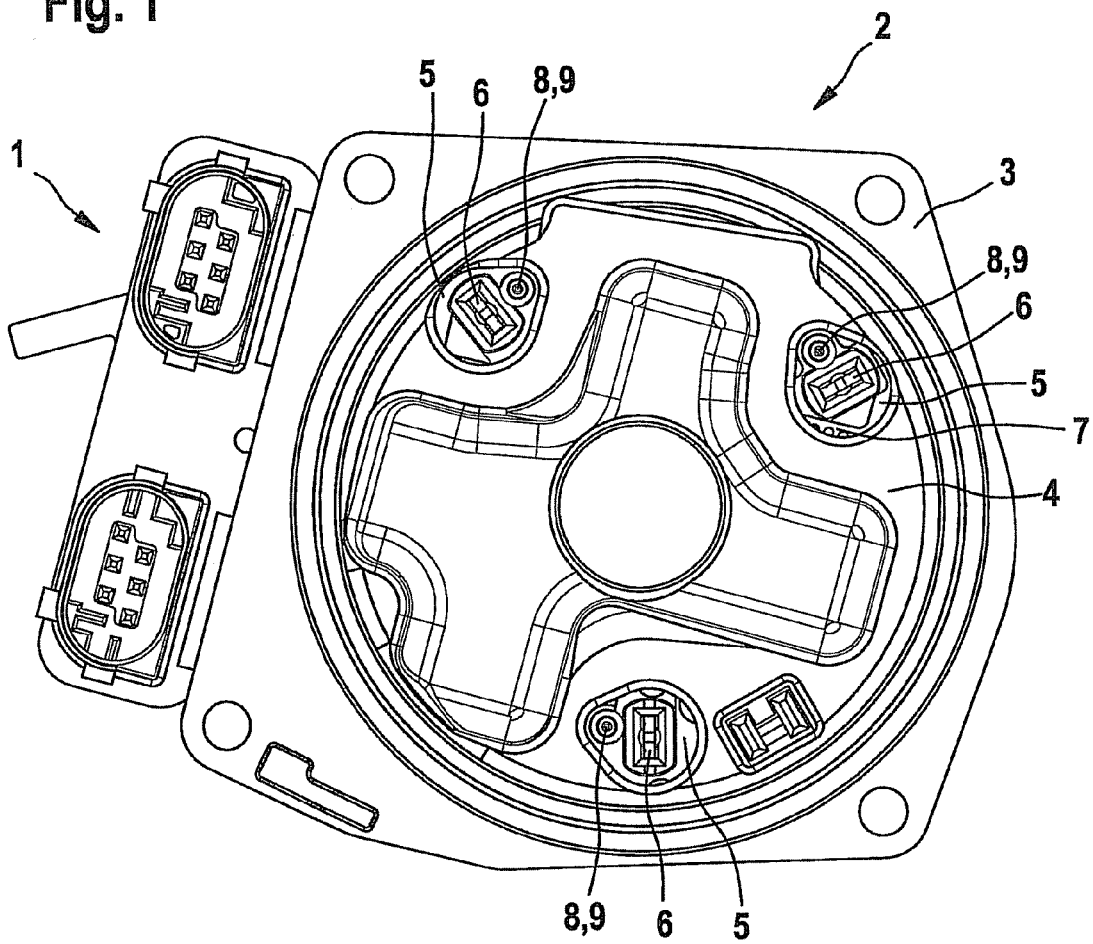
FIG. 1 shows a top view of an electrical/electronic device having test contact points according to an embodiment of the present invention.

In an exemplary embodiment, FIG. 1 shows in a top view an electrical/electronic device 1 in the form of an electric motor 2 having a housing 3 on which a housing cover 4 is situated. Housing cover 4 has three openings 5, which are located above plug contact devices 6 of a printed circuit board 7 situated below housing cover 4. Beside each of the plug contact devices 6, a test contact point 8 is provided, which is developed as recess 9. In this instance, recesses 9 have a circular cross section. Openings 5 are shaped in such a way that test contact point 8 is freely accessible, as is also shown in a detail view of test contact point 8 in FIG. 2.

Figure 2:
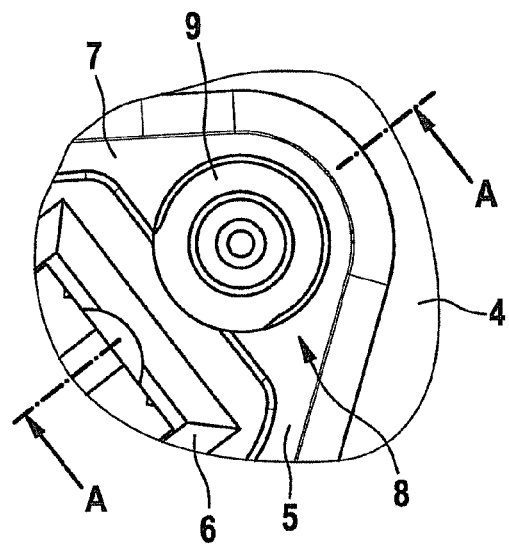
FIG. 2 shows a detail view of a test contact point.
Figure 3:
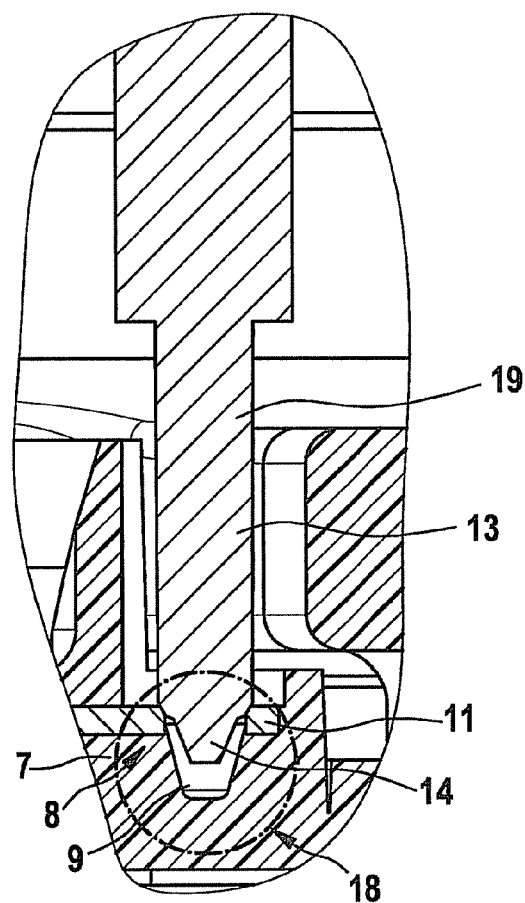
FIG. 3 shows a contact configuration according to an embodiment of the present invention.
Figure 4:
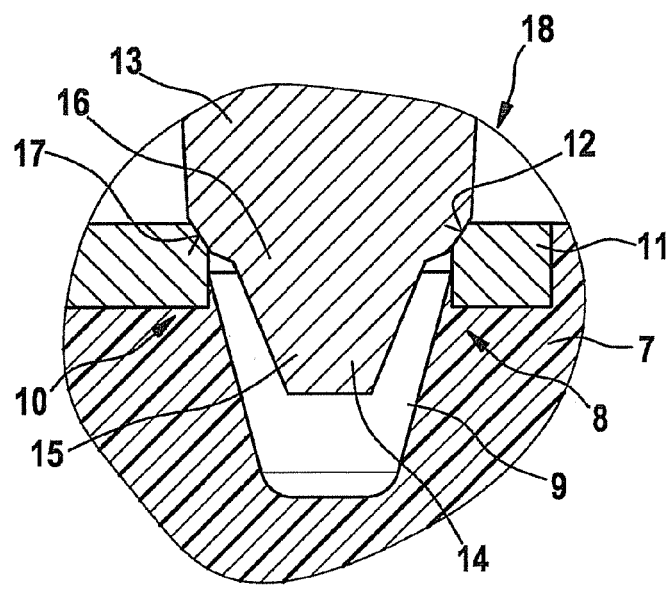
FIG. 4 shows a detail view of the contact configuration according to an embodiment of the present invention.

FIG. 3 shows a sectional view of test contact point 8 along a section A-A from FIG. 2, a contacting element 13 being guided into recess 9 by a contact tip 14. FIG. 4 additionally shows a detail view of contact tip 14 of contacting element 13. FIG. 4 furthermore shows recess 9 in printed circuit board 7, recess 9 being developed in the shape of a cone segment. In edge region 10, the recess has a conductor element 11, for example of a circuit trace of printed circuit board 7. Conductor element 11 thus forms the region of recess 9 that is able to make electrical contact. Advantageously, conductor element 11 has a conically developed test contact surface 12, which thus forms a cone segment-shaped section of recess 9.

Contact point 14 of contacting element 13 is developed in the shape of a cone segment and extends into recess 9. Contact point 14 has a first contact tip region 15, which is developed in the shape of a cone segment, and a second contact tip region 16, which is likewise developed in the shape of a cone segment, its smallest diameter being greater than the greatest diameter of contact tip region 15. The diameters of both regions increase counter to the direction in which contacting element 13 is inserted into receptacle 9. Contact tip region 16 forms a contact region 17 of contacting element 13, which produces an advantageous surface contact together with recess 9 or conductor element 11 of recess 9. In this instance, contact tip region 15 acts as an aid for inserting contacting element 13 into recess 9.

Because of the surface contact, electrical contact configuration 18 formed by contacting element 13 and recess 9 allows for the use of a testing current above 10 Amperes, that is, in the high current range, for the purpose of testing device 1.

In addition, FIG. 3 shows an advantageous design of contacting element as a test pin 19. Because of the pin shape, contacting element 13 or test pin 19 is even able to reach deeper test contact points 8 in a particularly simple manner. Because of the advantageous design of contact tip 14, test pin 19 is automatically aligned on test contact point 8 or in recess 9, an advantageous surface contact being produced in the process.

FIG. 5 shows the contact configuration 18 from FIGS. 3 and 4, contacting element 13 being represented in two different positions 13' and 13". The cone segment-shaped development of recess 9 and of test contact surface 12 and contact region 17 allows for a tolerance compensation, contacting element 13 or test pin 19 being inserted into recess 9 in a tilted manner and a surface contact being produced nevertheless, at least in regions.

If contact region 17 and test contact surface 12 are advantageously shaped as a sphere segment, then the contact surface produced or the surface contact produced always remain the same when contacting element 13 or test pin 19 are tilted into one of positions 13' or 13".

If recess 9 or conductor element 11 has no shape-adapted test contact surface, which is developed in the shape of a cone segment as shown in the exemplary embodiment, then a line contact is produced, which likewise allows for a higher current flow in comparison to the related art.

In another specific embodiment of contact configuration 18, the recess is advantageously developed as a passage, preferably as a plated through-hole of printed circuit board 7.

What is claimed is:

1. An electrical contact configuration, comprising:
   a test contact point; and
   a contacting element belonging to a testing device for manually touch-contacting the test contact point, the contacting element having a first contact region and a second contact region, wherein the first contact region has a diameter smaller than a diameter of the second contact region;
   wherein the test contact point is a recess, and the first contact region produces at least one line contact with the recess.

2. An electrical contact configuration, comprising:
   a test contact point; and
   a contacting element belonging to a testing device for manually touch-contacting the test contact point, the contacting element having a first contact region and a second contact region, wherein the first contact region has a diameter smaller than a diameter of the second contact region;
   wherein the test contact point is a recess, and the second contact region produces at least one surface contact with the recess.

3. The electrical contact configuration as recited in claim 1, wherein at least one of the contacting element and the recess has a circular cross section.

4. The electrical contact configuration as recited in claim 1, wherein the diameter of the first region of the contacting element is smaller than that of the recess.

5. The electrical contact configuration as recited in claim 1, wherein the contacting element has a contact tip in a shape of one of a cone segment or a sphere segment, at least in regions.

6. The electrical contact configuration as recited in claim 5, wherein the contact tip has the first contact region.

7. The electrical contact configuration as recited in claim 5, wherein a maximum diameter of the contact tip is greater than a maximum diameter of the recess.

8. The electrical contact configuration as recited in claim 1, wherein the recess is developed in a shape of one of a cone segment or a sphere segment, at least in regions.

9. The electrical contact configuration as recited in claim 5, wherein the contact tip and the recess are adapted to each other in terms of shape.

10. The electrical contact configuration as recited in claim 1, wherein the recess is grooved.

11. The electrical contact configuration as recited in claim 5, wherein the contact tip is a polyhedron.

12. The electrical contact configuration as recited in claim 1, wherein the recess is a passage.

13. The electrical contact configuration as recited in claim 12, wherein the passage is a plated through-hole.

14. The electrical contact configuration as recited in claim 2, wherein at least one of the contacting element and the recess has a circular cross section.

15. The electrical contact configuration as recited in claim 2, wherein the diameter of the first region of the contacting element is smaller than that of the recess.

16. The electrical contact configuration as recited in claim 2, wherein the contacting element has a contact tip in a shape of one of a cone segment or a sphere segment, at least in regions.

17. The electrical contact configuration as recited in claim 16, wherein the contact tip has the first contact region.

18. The electrical contact configuration as recited in claim 16, wherein a maximum diameter of the contact tip is greater than a maximum diameter of the recess.

19. The electrical contact configuration as recited in claim 2, wherein the recess is developed in a shape of one of a cone segment or a sphere segment, at least in regions.

20. The electrical contact configuration as recited in claim 16, wherein the contact tip and the recess are adapted to each other in terms of shape.

* * * * *